United States Patent
Cheng

(10) Patent No.: US 7,857,627 B2
(45) Date of Patent: Dec. 28, 2010

(54) BASE BOARD WITH GOLDEN FINGERS AT ONE END AND A PLURALITY OF WIRES ATTACHED AT THE OTHER END

(75) Inventor: Yung-Chang Cheng, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/535,361

(22) Filed: Aug. 4, 2009

(65) Prior Publication Data

US 2010/0029101 A1 Feb. 4, 2010

(30) Foreign Application Priority Data

Aug. 4, 2008 (CN) .......................... 2008 2 0301711

(51) Int. Cl.
*H01R 12/00* (2006.01)
(52) U.S. Cl. ....................................................... 439/59
(58) Field of Classification Search ................... 439/59, 439/61, 638, 654, 75, 460
See application file for complete search history.

(56) References Cited

U.S. PATENT DOCUMENTS

| 6,290,532 | B1 * | 9/2001 | Vermeersch et al. ......... 439/460 |
| 6,585,528 | B1 * | 7/2003 | Lin et al. .................... 439/76.1 |
| 7,442,057 | B2 * | 10/2008 | Ko ............................. 439/101 |
| 7,497,738 | B2 * | 3/2009 | Kuo ........................... 439/638 |
| 2007/0082509 | A1 * | 4/2007 | Kuo ............................ 439/45 |

* cited by examiner

*Primary Examiner*—Chandrika Prasad
(74) *Attorney, Agent, or Firm*—Wei Te Chung; Andrew C. Cheng; Ming Chieh Chang

(57) ABSTRACT

A connector assembly includes an electric connector, and a cable assembly mated with the electric connector. The electric connector includes a housing, a plurality of contacts received in the housing. The cable assemble includes a base board with a plurality of golden fingers, and a plurality of wires electrically connected to the golden fingers. The base board includes a mating portion and a connecting portion connected to the mating portion. The golden fingers are arranged on the mating portion and the wires are physically connected to the connecting portion. The mating portion is inserted into the housing of the electric connector.

20 Claims, 4 Drawing Sheets

BASE BOARD WITH GOLDEN FINGERS AT ONE END AND A PLURALITY OF WIRES ATTACHED AT THE OTHER END

BACKGROUND OF THE INVENTION

1. Field of the Invention

The present invention relates generally to a cable assembly and its complementary connector, specially, that the cable assembly includes a printed circuit board serving as an connector for connecting to the complementary connector located inside an electrical device.

2. Description of the Prior Art

A cable assembly, which is used to connect with a complementary connector, commonly includes a housing, a plurality of contacts and a plurality of wires respectively connected terminated to contacts. When the cable assembly is used inside of an electrical device, it seems too big and complex.

Hence, in this art, an improved cable assembly to overcome the above-mentioned disadvantages of the prior art should be provided.

BRIEF SUMMARY OF THE INVENTION

A primary object, therefore, of the present invention is to provide a low-profile and simple cable assembly and its complementary connector.

In order to implement the above object, the connector assembly comprises an electric connector, and a cable assembly mated with the electric connector. The electric connector comprises a housing, a plurality of contacts received in the housing. The cable assemble comprises a base board with a plurality of golden fingers, and a plurality of wires electrically connected to the golden fingers. The base board comprises a mating portion and a connecting portion connected to the mating portion. The golden fingers are arranged on the mating portion and the wires are physically connected to the connecting portion. The mating portion is inserted into the housing of the electric connector.

Other objects, advantages and novel features of the invention will become more apparent from the following detailed description of a preferred embodiment when taken in conjunction with the accompanying drawings.

DETAILED DESCRIPTION OF THE INVENTION

Reference will now be made in detail to a preferred embodiment of the present invention.

Figure 1:
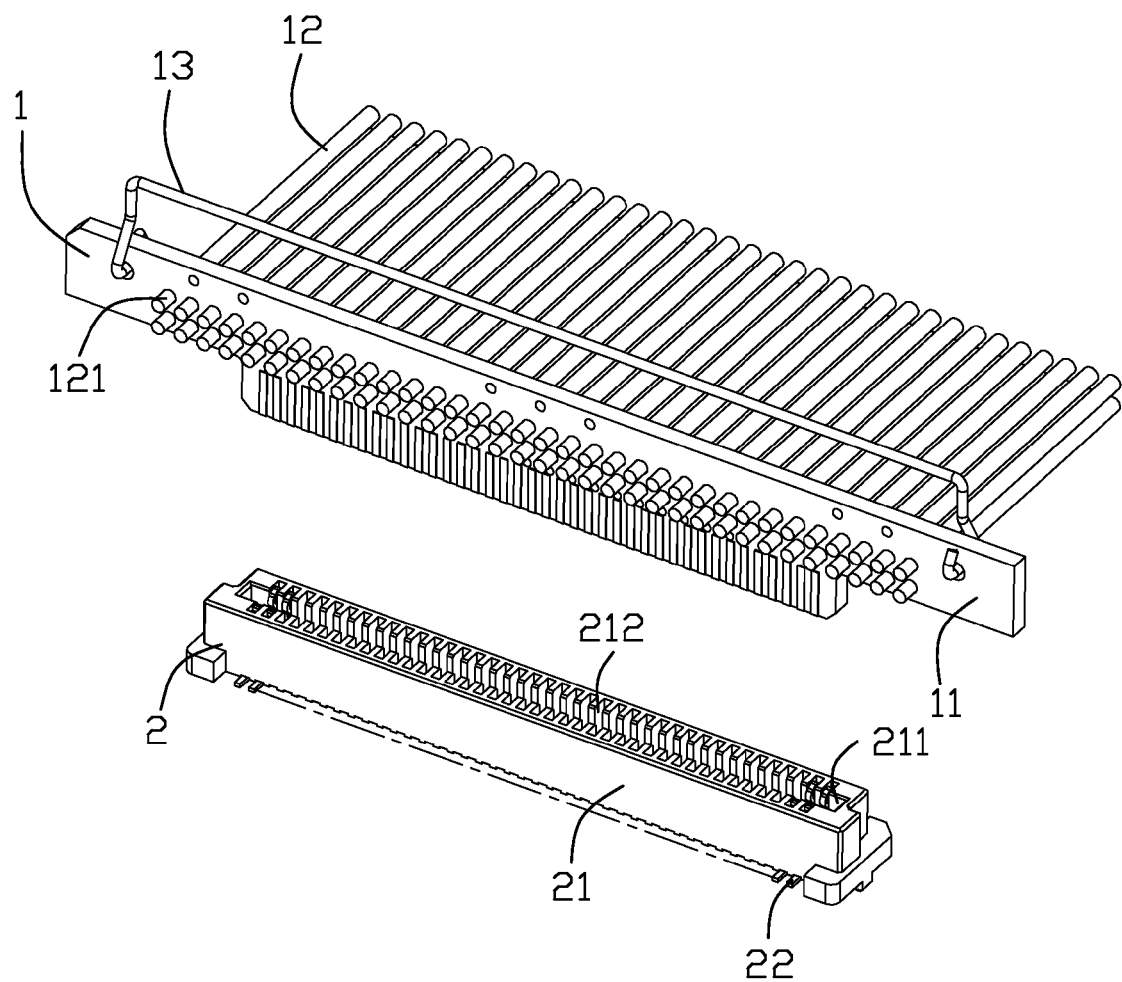
FIG. 1 is a perspective view illustrating a cable assembly and a complementary connector according to a preferred embodiment of the present invention.
Figure 2:
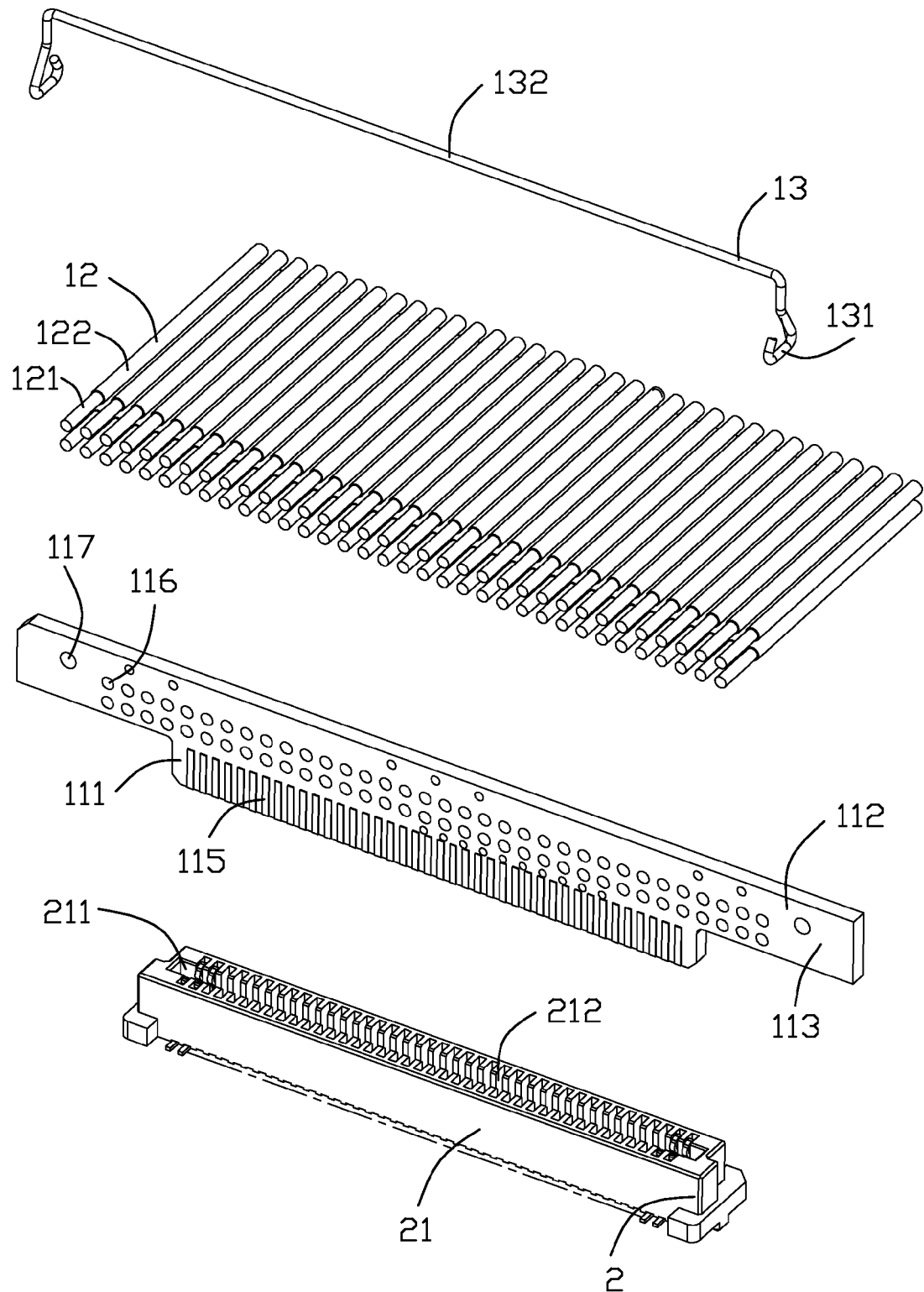
FIG. 2 is an exploded, perspective view of FIG. 1.
Figure 3:
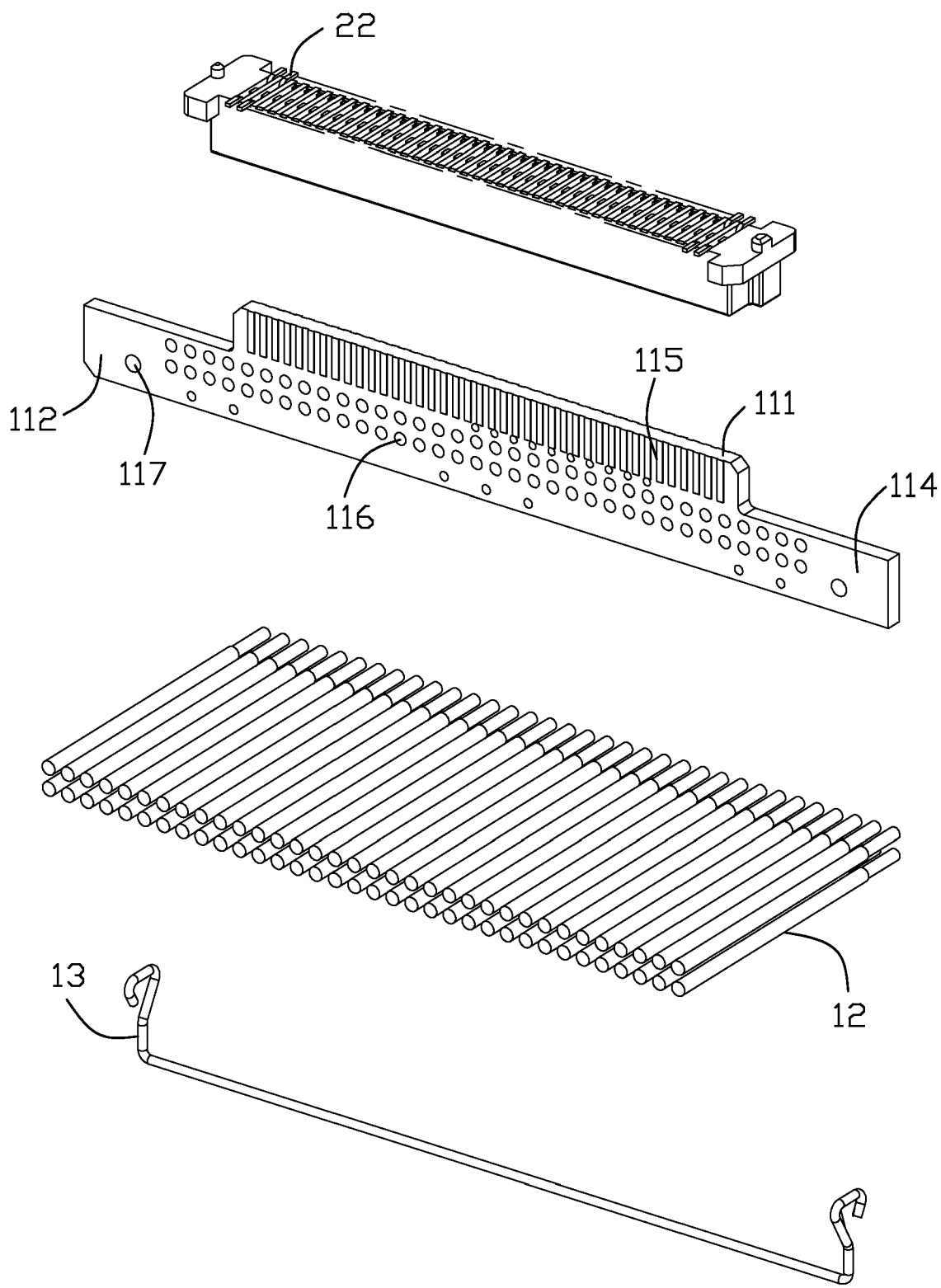
FIG. 3 is an exploded, perspective view similar to FIG. 2, but viewed from another angle.
Figure 4:
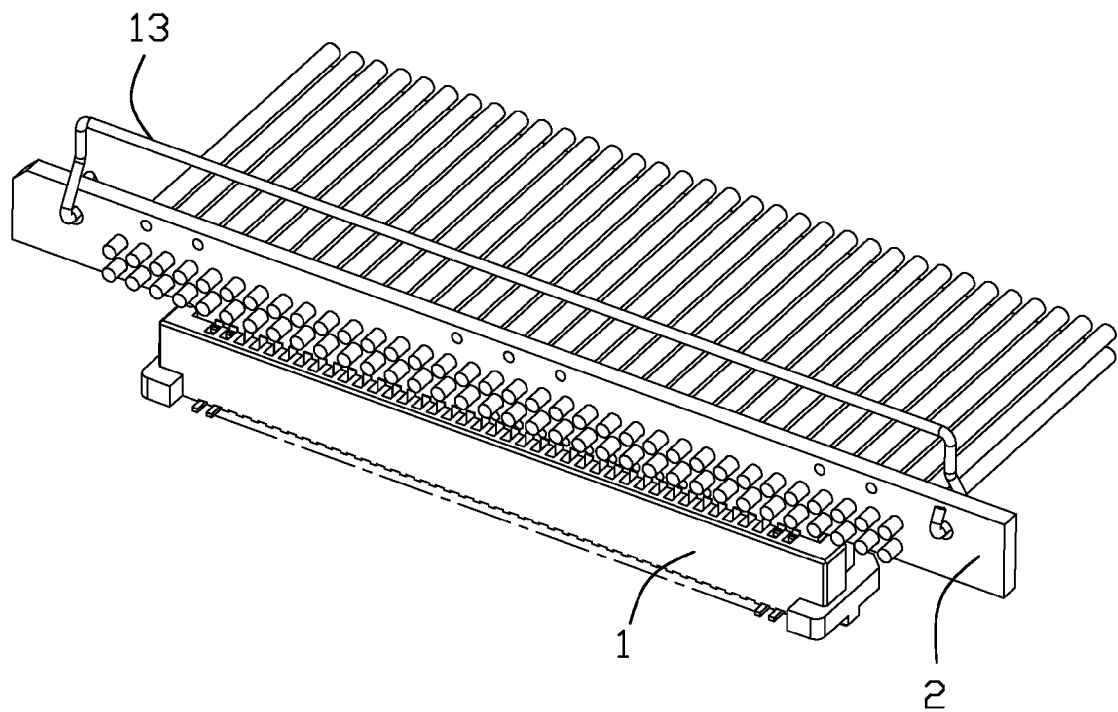
FIG. 4 is a perspective view illustrating the cable assembly connected to the complementary connector.

Reference to FIGS. 1 to 4, a cable assembly 1 includes a printed circuit board (PCB) 11, a plurality of wires 12 connected to the PCB 11, and a pull-off device 13 connected to the PCB 11.

The PCB 11 is configured as a T shape and includes a mating portion 111 with a first surface 113 and a second surface 114 and a connecting portion 112 connected to the mating portion 111. The connecting portion 112 extends along a transverse direction and substantially is rectangular. The mating portion 111 extends from one edge of the connecting portion 112 and located on the center of the edge. The connecting portion 112 is wider than the mating portion 111 and located on a same plane with that the mating portion is located. Those two portions 111, 112 form the T-shaped configuration. The mating portion 111 includes two rows of golden fingers 115 respectively arranged on edges of a first surface 113 and a second surface 114 thereof. A plurality of vias 116 is formed on the connecting portion 112 and arranged in two rows along a vertical direction. Each via 116 has a conducting pad (not labeled) therein. A pair of apertures 117 is located on the two sides of the vias 116 on the connecting portion 112. The vias 116 is corresponding to the golden fingers 115 and each conducting pad in the via 116 is electrically connected its corresponding golden finger 115 via a conducting wire (not shown) in the PCB.

The wires 12 are organized and arranged corresponding to the vias 116. Each of the wires 12 includes a conductor 121 and an insulation cover 122. The conductor 121 has an end exposed out the insulation cover 122 and is passed through its corresponding via 116 to be electrically connected to its corresponding conducting pad. The conductor 121 is electrically connected to the conducting pad along a direction perpendicular to the PCB 11 through being soldered on the first surface 13 by wave-soldering method.

The pull-off device 13 includes a pair of hooks 131 and a connecting pole 132 connecting the two hooks 131. The hooks 131 respectively pass through the apertures 117 of the PCB 11 so as to be fastened on the PCB 11. The connecting pole 132 is located on one side of the PCB 11 opposite to the mating portion 111 for the cable assembly 1 being easily pull out from the complementary connector 2.

The complementary connector 2 has one side fastened on a PCB (not shown) and another sides mated to the cable assembly 1. The complementary connector 2 includes a housing 21, a plurality of contacts 22 received in the housing 21 and corresponding to the golden fingers. The housing includes a receiving space 211 in the middle thereof, and a plurality of receiving slots 212 located on two sides of the receiving space 211. The contacts 22 are arranged in two rows to be corresponding to the receiving slots 212 and respectively received in its corresponding receiving slot 212.

The cable assembly 1 is mated to the complementary connector 2. When the two connectors are mated to each other, the mating portion 111 of the PCB 11 is inserted into the complementary connector 2 to be received in the receiving space 211 and the golden fingers 115 are respectively connected to its corresponding contacts 22.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cable assembly, for being mated with a complementary connector, comprising:

a base board, comprising a mating portion and a connecting portion wider than the mating portion, said mating portion having at least one row of golden fingers respectively arranged on an edge thereof opposite to the connecting portion, said connecting portion defining a plurality of vias with conducting pad therein; and a plurality of wires organized and arranged corresponding to the vias, each wire being connected to positioned within a corresponding via;

said mating portion of the base board is used to be inserted into the complementary connector.

2. The cable assembly as claimed in claim 1, wherein said each wire is connected to the via along a direction perpendicular to the base board.

3. The cable assembly as claimed in claim 1, wherein said vias are arranged along two rows parallel to each other.

4. The cable assembly as claimed in claim 1, wherein said mating portion comprises a first surface and a second surface, and said golden fingers are arranged along two rows respectively on edges of the two surfaces of the mating portion of the base board.

5. The cable assembly as claimed in claim 1, wherein said mating portion and the connecting portion form a T shape.

6. The cable assembly as claimed in claim 1, wherein said cable assembly further comprises a pull-off device fastened on the connecting portion to make the cable assembly easily pull out from the complementary connector.

7. The electrical assembly as claimed in claim 6, wherein the pull-off device comprises a pair of hooks and a connecting pole connecting the two hooks.

8. A connector assembly, comprising:
an electric connector, comprising a housing, a plurality of contacts received in the housing; and
a cable assembly mated with the electric connector and can be pulled out of the electric connector, comprising a base board with a plurality of golden fingers, a plurality of wires electrically connected to the golden fingers;
said base board comprising a mating portion and a connecting portion connected to the mating portion, said golden fingers being arranged on the mating portion and the wires being physically connected to the connecting portion, said mating portion being inserted into the housing of the electric connector.

9. The connector assembly claimed in claim 8, wherein said housing of the electric connector comprising a receiving space and the mating portion is received into the receiving space.

10. The connector assembly as claimed in claim 9, wherein said electric connector further comprise a plurality of receiving slots respectively arranged on the two sides of the receiving space of the housing.

11. The connector assembly as claimed in claim 8, wherein said connecting portion comprises a plurality of vias corresponding to the wires.

12. The connector assembly as claimed in claim 11, wherein said wires respectively pass through the vias and are connected to the connecting portion along a direction perpendicular to the connecting portion and via wave-soldering method.

13. The connector assembly as claimed in claim 8, wherein said connector assembly further comprises a pull-off device fastened on the connecting portion to make the cable assembly easily pull out from the electric connector.

14. The electrical assembly as claimed in claim 13, wherein the pull-off device comprises a pair of hooks and a connecting pole connecting the two hooks.

15. An electrical assembly comprising:
a cable assembly including:
a printed circuit board extending along a lengthwise direction and defining a planar front mating portion with gold fingers thereon for optionally mating with a complementary connector, and a rear connection portion; and
a plurality of deflectable wires respectively mechanically and electrically connected to the connection portion; wherein
the mating portion is smaller than the connection portion along said lengthwise direction, and a pull-off device is attached to the connection portion for withdrawal of said cable assembly from said complementary connector.

16. The electrical assembly as claimed in claim 15, wherein said complementary connector defines an elongated slot with a plurality of contacts by two sides thereof so that the mating portion is adapted to be inserted into the elongated slot with said gold fingers mechanically and electrically connected to the corresponding contacts, respectively.

17. The electrical assembly as claimed in claim 15, wherein said printed circuit board defines a plurality of through holes in the connection portion to receive the corresponding wires, respectively.

18. The electrical assembly as clamed in claim 17, wherein a front end of each of said wires extends from one surface of the printed circuit board, through the corresponding through hole and exposed unto the other side of an opposite surface of the printed circuit board.

19. The electrical assembly as claimed in claim 15, wherein the pull-off device is connected to the connection portion at a pair of positions located outside of the mating portion in said lengthwise direction.

20. The electrical assembly as claimed in claim 15, wherein both said printed circuit board and said pull-off device are essentially fully exposed to and accessible from an exterior during mating with the complementary connector.

\* \* \* \* \*